United States Patent [19]

Vanyi

[11] 3,923,002

[45] Dec. 2, 1975

[54] SOLDERING MACHINE ACCESSORY

[76] Inventor: Louis Vanyi, 246 Crestwood Ave., Ventura, Calif. 93003

[22] Filed: Aug. 24, 1973

[21] Appl. No.: 391,192

[52] U.S. Cl. ................ 118/110; 118/204; 118/429; 228/36

[51] Int. Cl.² ........................................ B05C 11/105

[58] Field of Search ........... 118/110, 111, 204, 258, 118/302, 429, 423; 228/34, 37, 35, 36

[56] References Cited

UNITED STATES PATENTS

| | | | |
|---|---|---|---|
| 2,791,669 | 5/1957 | Ferrara | 228/35 |
| 3,135,630 | 6/1964 | Bielinski et al. | 118/410 |
| 3,604,609 | 9/1971 | Walls | 228/37 |
| 3,627,191 | 12/1971 | Hood | 228/19 |
| 3,710,759 | 1/1973 | Tardoskegyi et al. | 118/123 |

*Primary Examiner*—Mervin Stein
*Assistant Examiner*—Douglas Salser
*Attorney, Agent, or Firm*—Richard S. Sciascia; Joseph M. St.Amand; David O'Reilly

[57] ABSTRACT

A solder removing accessory for wave soldering machines. The accessory is comprised of a rotatable metal brush which is held lightly against a printed circuit board immediately after it has passed over a molten solder bath and before it hardens. The brush accessory has heat conducting characteristics and, by capillary action, removes excess solder and spreads the remaining solder in a controlled, uniform, thin film manner over the conductive portions of the printed circuit board.

5 Claims, 2 Drawing Figures

SOLDERING MACHINE ACCESSORY

STATEMENT OF GOVERNMENT INTEREST

The invention described herein may be manufactured or used by or for the Government of the United States of America for governmental purposes without the payment of any royalties thereon or therefor.

BACKGROUND OF THE INVENTION

This invention relates to automatic soldering machines for coating printed circuit boards with solder and more particularly relates to an accessory for wave solder machines which provides a uniform, thin film of solder on printed circuit boards.

Numerous devices and methods are available for providing a coating of solder on printed circuit boards. One of the oldest methods is to perform this function by a handsoldering technique which requires a large amount of time and uses up many manhours. Another method is dip soldering in which the printed circuit board would be completely immersed in a bath of molten solder. The difficulties with this method is it was nearly impossible to achieve a uniform, thin film of solder. Usually the boards would have solder icycles or burs which would then have to be buffed off by hand, requiring a great amount of time and expense. Ultimately, automatic wave soldering machines were developed and are now used extensively in the field. These machines apply a thin coating of solder to the delicate copper strip conductive paths of a printed circuit board by passing the boards by conveyor (circuit side down) over a continuously flowing fountain of molten solder. However, great difficulty has been experienced in controlling the thickness of the deposited film and the uniformity of its distribution. The application of a uniform coating of solder to each printed circuit board is essential to satisfactory use of the board. This method frequently produced a great number of rejects.

A great many solutions have been offered to the problem of providing a thin, uniform coating of solder on printed circuit boards by the automatic wave soldering machines. These include such devices as machines which apply a uniform coating of flux, other machines which spray oil on the board prior to soldering and still other devices which provide a brush which buffs or scrubs the board clean after it has been coated. Still another solution to this problem has been to pass the coated board over a wave cleaning station in which the board is scrubbed with a brush after being sprayed with a solvent. None of these solutions have been entirely satisfactory.

SUMMARY OF THE INVENTION

The purpose of the present invention is to solve the above described difficulties and provide a uniform, thin film of solder coated on a printed circuit board. It almost entirely eliminates the requirement to hand-clean, or provide machine cleaning of, the coated board after it has been tinned with solder. The present invention provides a wire metal brush which lightly contacts the printed circuit board immediately after it has passed through the fountain of molten solder before the solder hardens. The wire metal brush has heat conducting and solder wettability characteristics and draws off excess solder by a capillary action. The brush is constructed and mounted to be moved from an idle position to a ready position when a board is passing above it. When not in use, the brush is in the idle position and is immersed in a pool of molten solder. The excess solder drawn into the metal brush flows down the brush and back into the solder bath for reuse, because the lower portion of the brush is in contact with the molten solder. It has been found that this apparatus and technique provides the required uniform, thin film of solder without any burs or solder icycles and few rejects have been noticed. Also, no further hand cleaning of the boards after the tinning process has been required.

OBJECTS OF THE INVENTION

It is one object of the present invention to provide an accessory for an automatic wave soldering machine which provides a uniform thin film of solder on printed circuit boards.

Another object of the present invention is to provide an accessory for an automatic wave soldering machine which draws off excess solder from the printed circuit board by a capillary action.

Yet another object of the present invention is to provide an accessory for a wave soldering machine which provides a thin uniform film of solder which requires no cleaning after the tinning process.

Still another object of the present invention is to provide an accessory for an automatic wave soldering machine which removes excess solder immediately after the tinning process and returns the solder to the molten bath for reuse.

Other objects, advantages, and novel features of the invention will become apparent from the following detailed description of the invention when considered in conjunction with the accompanying drawings.

DETAILED DESCRIPTION OF THE PREFERRED EMBODIMENT

Figure 1:
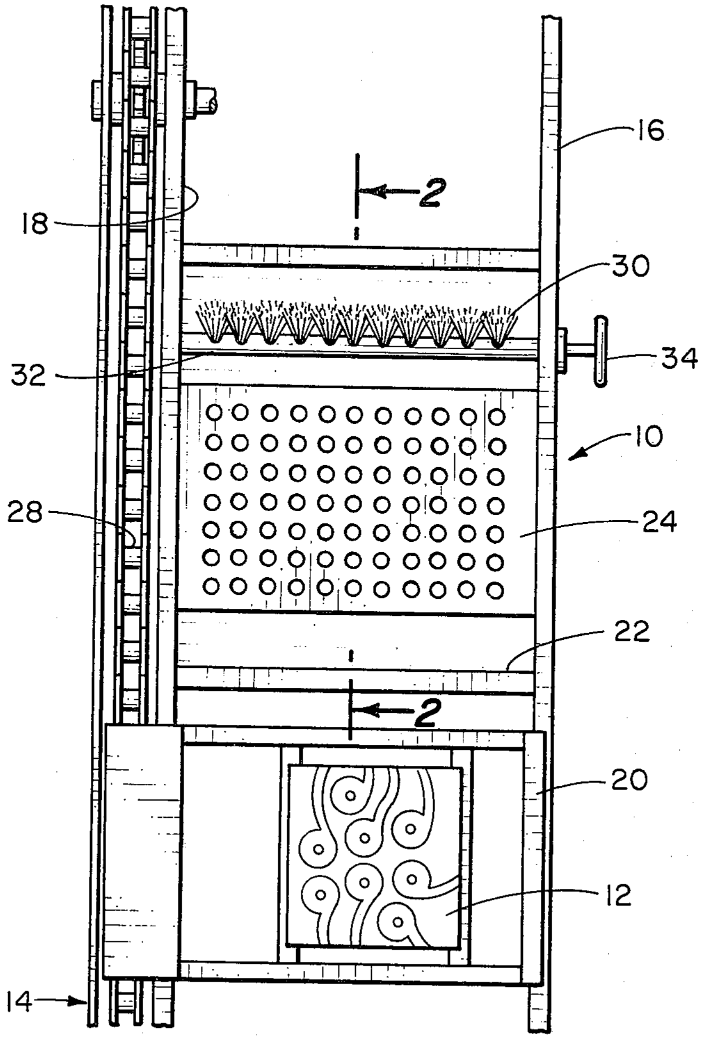
FIG. 1 illustrates a typical automatic wave soldering machine with the accessory of the present invention for removing excess solder after the tinning process.
Figure 2:
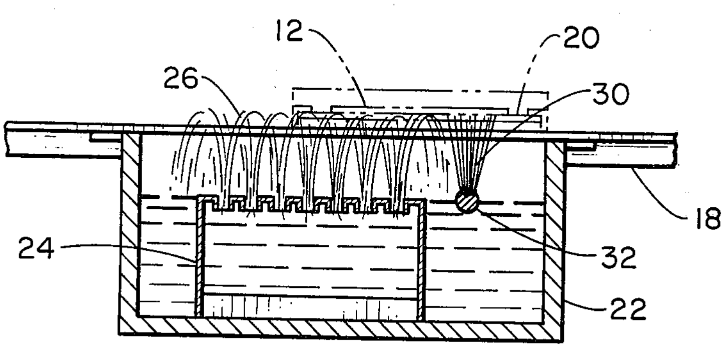
FIG. 2 is a sectional view taken from FIG. 1 which shows the automatic wave soldering machine accessory and its relative position with respect to the molten solder bath and the fountain of molten solder.

Referring now to FIG. 1, there is shown a typical automatic wave soldering machine 10 for applying a thin film of solder to a printed circuit board 12. The automatic wave soldering machine is comprised of a conveyor 14 usually having two rails 16, 18, a holder 20 for rigidly supporting the printed circuit board 12, a well 22 containing molten solder and a head 24 containing a plurality of holes through which the molten solder is pumped to produce a fountain of solder 26 (FIG. 2). In the automatic wave soldering machine illustrated, one rail 18 has a slowly rotating chain 28 which engages the printed circuit board holder 20, moving it across the fountain of molten solder 26. In most machines of this type, the speed of the printed circuit board holder 20 can be varied to vary the thickness of the molten solder coated on the printed circuit board 12. Frequently, this tinning process results in burs, solder icycles and clogging of the component mounting holes in the printed circuit board. This results in numerous printed circuit boards either being rejected or requiring a time-consuming hand operation to remove the burs and solder icycles.

To remedy these defects, a wire metal brush 30 is provided in the automatic wave soldering machine 10. The brush 30 is mounted between the rails 16, 18 of the solder machine 10 adjacent to the fountain of molten solder 26, as shown in FIG. 2. The brush 30 is mounted so that it can be rotated from a horizontal position to a vertical position. As a printed circuit board 12 passes over the fountain of molten solder 26, the wire brush 30 is rotated to a vertical position to come in contact with the underside of the printed circuit board 30 immediately after it has passed through the fountain of molten solder 26 and before the solder hardens. The brush draws excess solder from the printed circuit board 12 by capillary action and returns it to the molten solder bath in well 22. As can be seen in FIG. 2, the rod 32 supporting the brush 30 is mounted with its axis perpendicular to the direction of motion of the printed circuit board and in contact with the fountain of molten solder 26 to permit the excess solder in the brush 30 drawn from the printed circuit board 12 to run back into the molten solder bath in well 22. Utilization of capillary attraction to withdraw solder from the printed circuit board effectively removes excess solder, leaving a uniform thin coating.

In order to utilize capillary attraction, the metal of brush 30 should be of a material which is readily wettable by solder. The material of the wire brush should preferably also be a good conductor of heat, such as iron, steel, or copper. The length of the bristles are proportioned to assure that the printed board is not wiped or scrubbed by the brush to prevent removal of too much solder and also avoid any damage to the board. The brush 30 is preferably made of a carbon steel having a thin coating of copper which after first use becomes "tinned" with a coating of solder. While simple copper is suitable for the brush, it has been found that it has a relatively short life when exposed to air and sustained heat because it tends to oxidize. Other metals which are readily wettable by solder and which are good heat conductors would also be suitable for the brush 30. However, steel is preferred because it is quite hard and makes a very firm brush which has a greatly extended life.

The brush 30 is mounted immediately after the fountain of molten solder 26 in order to draw the liquid solder off the printed circuit board before it has a chance to harden. The width of the brush 30 is selected to assure complete coverage of the printed circuit board 12. The brush 30 is rotated to a vertical position to lightly contact the printed circuit board 12 and draw off the excess solder, leaving a smooth coating on the board 12. When not in use, the brush 30 lies in a horizontal or a downward position with the bristles lying in a pool of liquid solder in well 22 in order to preheat and tin them so that when they are rotated to a vertical position they will readily draw the liquid solder from the printed circuit board 12. As shown in FIG. 1, a handle 34, attached to the rod 32 supporting the brush 30, permits manual rotation of the brush to a vertical position. Alternatively, an automatic tripping device (not shown) could be provided which rotates the brush to a vertical position when the printed circuit board 12 comes in contact with the fountain of molten solder 26.

The complete operation of the wave solder machine and accessory for removing excess solder is as follows. A printed circuit board 12 is attached to a holder 20 which rigidly supports the printed circuit board 12 for tinning in the automatic wave solder machine 10. The holder 20 is then placed on the conveyor 14 with the slowly revolving chain 28 engaging the holder 20 and moving it along the rails 16, 18 toward the fountain of molten solder 26. As the printed circuit board 12 passes through the fountain of molten solder 26, the solder adheres to the underside of the board 12. As the board 12 begins to emerge from the fountain of molten solder 26, the wire metal brush 30 is rotated to a vertical position by handle 34 to lightly contact the underside of the printed circuit board 12. The excess solder, which is still liquified, is withdrawn from the board by the capillary action of the wire metal brush 30. Since the lower portion of the brush 30 and supporting rod 32 is in contact with the molten solder bath, the excess solder withdrawn by the capillary action runs down the brush 30 and back into the well 22. The brush 30 normally idles in a pool of molten solder, which preheats and pretins the bristles, and is only raised into a vertical position when a printed circuit board 12 is overhead. This process removes all but a thin film of solder from the circuit board 12. The result is a uniform coating of shiny solder applied to the conductive copper surfaces which resembles a plating job.

Thus, there has been disclosed an accessory for an automatic wave soldering machine which provides an even, uniform coating of solder on a printed circuit board by drawing off excess solder by capillary action of a wire metal brush.

Obviously many modifications and variations of the present invention are possible in the light of the above teachings. It is therefore to be understood that within the scope of the appended claims the invention may be practiced otherwise than as specifically described.

I claim:

1. In a soldering machine for applying a coating of solder to the conductive portions of a printed circuit board by passing the board through a bath of molten solder, the improvement comprising:

a wire metal brush capable of removing solder from a surface by capillary action mounted on the soldering machine adjacent to the bath of molten solder;

means for removing said brush from an idle position to a ready position in which the brush contacts the liquid solder on the printed circuit board immediately after it passes through the molten solder bath;

in said ready position said brush being disposed to withdraw excess solder from said printed circuit board solely by capillary action and return the excess solder to the bath of molten solder.

2. The solder machine of claim 1 wherein the brush is comprised of a metal which has good heat conductivity and is readily wettable with solder.

3. The solder machine of claim 2 including means for preheating and pretinning the brush with a coating of solder.

4. The solder machine of claim 3 wherein the means for preheating and pretinning the brush comprises mounting the brush so that at idle position it lies in a pool of molten solder.

5. The solder machine of claim 4 wherein said means for moving said brush from an idle position to a ready position comprises a rotatable rod supporting the brush; said rotatable rod being mounted on the soldering machine with its axis perpendicular to the direction of motion of said printed circuit board.

* * * * *